(12) United States Patent
Koduri et al.

(10) Patent No.: US 12,198,995 B2
(45) Date of Patent: Jan. 14, 2025

(54) COVERS FOR SEMICONDUCTOR PACKAGE COMPONENTS

(71) Applicant: TEXAS INSTRUMENTS INCORPORATED, Dallas, TX (US)

(72) Inventors: Sreenivasan Kalyani Koduri, Allen, TX (US); Leslie Edward Stark, Heath, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/484,321

(22) Filed: Oct. 10, 2023

(65) Prior Publication Data

US 2024/0038609 A1 Feb. 1, 2024

Related U.S. Application Data

(63) Continuation of application No. 17/116,936, filed on Dec. 9, 2020, now Pat. No. 11,784,103.

(51) Int. Cl.
| | |
|---|---|
| *H01L 23/06* | (2006.01) |
| *H01L 21/56* | (2006.01) |
| *H01L 23/00* | (2006.01) |
| *H01L 23/16* | (2006.01) |
| *H01L 23/31* | (2006.01) |
| *H01L 23/495* | (2006.01) |

(52) U.S. Cl.
CPC .............. *H01L 23/16* (2013.01); *H01L 21/56* (2013.01); *H01L 23/315* (2013.01); *H01L 24/32* (2013.01); *H01L 24/48* (2013.01); *H01L 23/495* (2013.01); *H01L 2224/32245* (2013.01); *H01L 2224/48245* (2013.01)

(58) Field of Classification Search
CPC .............................. H01L 21/56; H01L 23/495
USPC ......................................................... 257/684
See application file for complete search history.

(56) References Cited

U.S. PATENT DOCUMENTS

| | | | |
|---|---|---|---|
| 4,975,762 A | 12/1990 | Stradley | |
| 5,786,738 A | 7/1998 | Ikata | |
| 5,897,338 A * | 4/1999 | Kaldenberg | .......... H01L 21/565 216/33 |
| 5,904,497 A * | 5/1999 | Akram | ................ H01L 23/3121 257/E23.125 |
| 6,274,927 B1 * | 8/2001 | Glenn | .................... H01L 23/10 257/710 |
| 6,531,334 B2 * | 3/2003 | Sasano | ............. H01L 27/14618 29/827 |
| 6,566,745 B1 | 5/2003 | Beyne | |
| 6,674,159 B1 | 1/2004 | Peterson | |
| 6,777,259 B2 | 8/2004 | Silverbrook | |
| 7,026,710 B2 * | 4/2006 | Coyle | ................ B81C 1/00333 257/787 |

(Continued)

*Primary Examiner* — Nitin Parekh
(74) *Attorney, Agent, or Firm* — Dawn Jos; Frank D. Cimino

(57) ABSTRACT

In some examples, a semiconductor package comprises a semiconductor die; an operational component on an active surface of the semiconductor die; and a cover coupled to the active surface of the semiconductor die and covering the operational component. The cover comprises a monolithic structure including a vertical portion and a horizontal portion. A hollow area is between the cover and the operational component. The package also includes a mold compound covering the semiconductor die and the cover.

20 Claims, 10 Drawing Sheets

(56) References Cited

U.S. PATENT DOCUMENTS

| | | | |
|---|---|---|---|
| 7,651,891 B1 | 1/2010 | Nguyen | |
| 8,852,986 B2 * | 10/2014 | Kuan | B29C 45/14655 |
| | | | 257/667 |
| 8,928,129 B2 | 1/2015 | Song | |
| 9,722,098 B1 * | 8/2017 | Chung | B81C 1/00825 |
| 10,396,040 B2 * | 8/2019 | Jian | H01L 25/0655 |
| 2004/0150977 A1 * | 8/2004 | Hsieh | H01L 23/3128 |
| | | | 257/E23.114 |
| 2008/0063232 A1 * | 3/2008 | Song | H04R 19/005 |
| | | | 381/355 |
| 2009/0026589 A1 | 1/2009 | Kuramoto | |
| 2010/0038776 A1 * | 2/2010 | Bessemoulin | H01L 23/66 |
| | | | 257/E23.181 |
| 2013/0020685 A1 | 1/2013 | Kwak | |
| 2014/0117517 A1 | 5/2014 | Fernando | |
| 2015/0303173 A1 * | 10/2015 | Maydar | H01L 21/6835 |
| | | | 257/664 |
| 2018/0168029 A1 | 6/2018 | Kuk | |

* cited by examiner

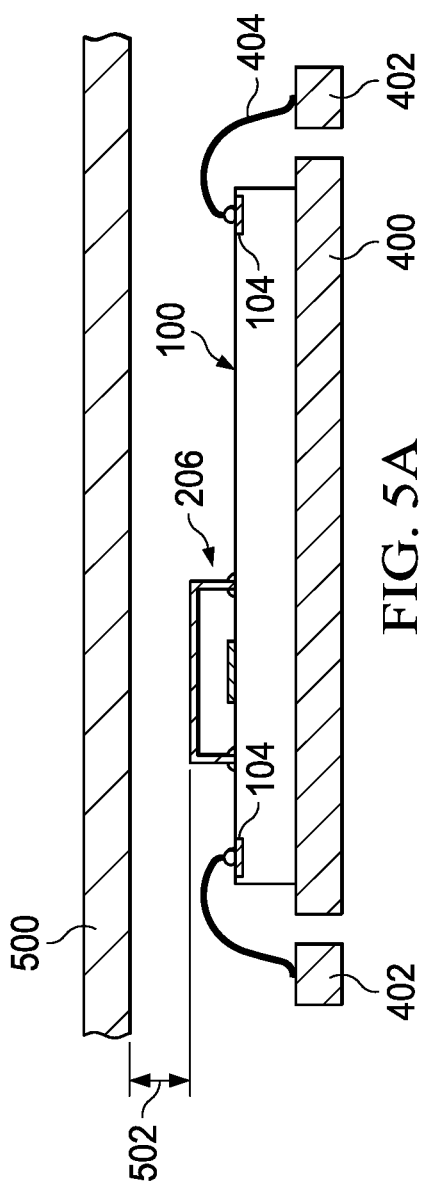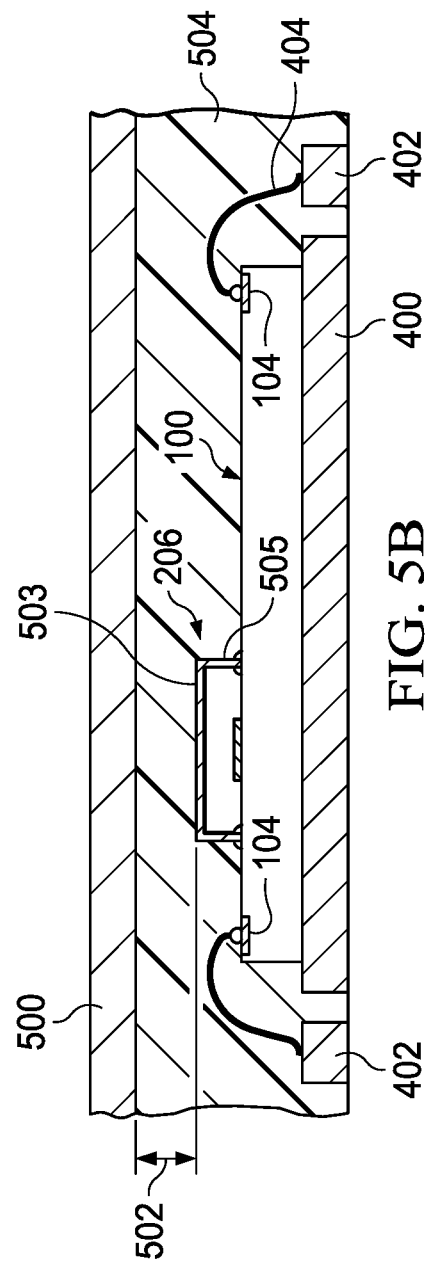

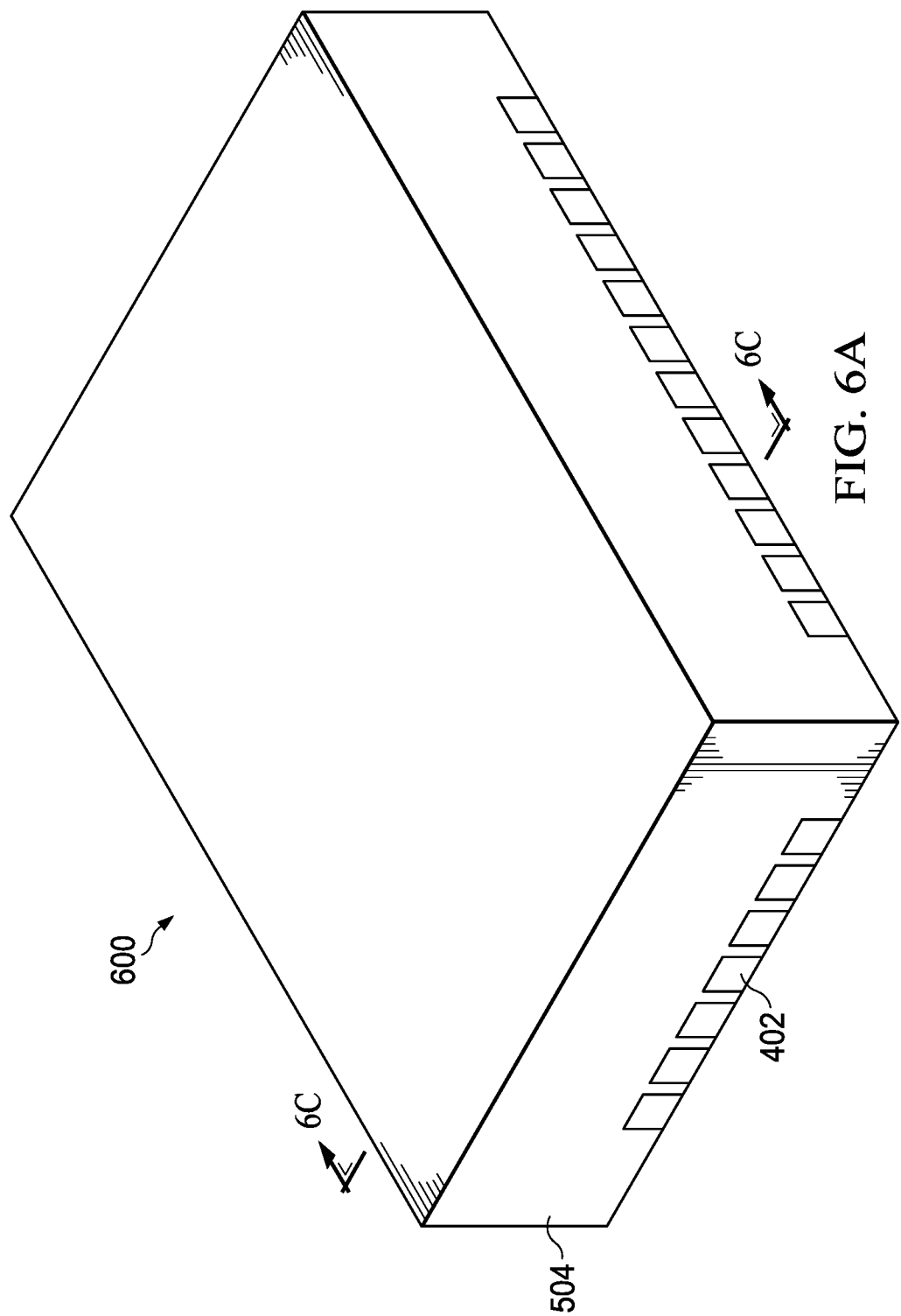

COVERS FOR SEMICONDUCTOR PACKAGE COMPONENTS

This application is a continuation of U.S. patent application Ser. No. 17/116,936, filed Dec. 9, 2020 (now U.S. Pat. No. 11,784,103), the contents of which are herein incorporated by reference in its entirety.

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

SUMMARY

In some examples, a semiconductor package comprises a semiconductor die; an operational component on an active surface of the semiconductor die; and a cover coupled to the active surface of the semiconductor die and covering the operational component. The cover comprises a monolithic structure including a vertical portion and a horizontal portion. A hollow area is between the cover and the operational component. The package also includes a mold compound covering the semiconductor die and the cover.

In some examples, a method comprises providing an inert atmosphere at an operational component of a semiconductor die; positioning a cover on the semiconductor die to cover the operational component of the semiconductor die, a hollow and inert area between the cover and the operational component; and positioning the semiconductor die and the cover in a mold chase. The method also comprises positioning a member of the mold chase so that the member does not abut the cover. The method also includes introducing a mold compound into the mold chase to cover the semiconductor die and the cover, the cover precluding the mold compound from abutting the operational component.

BRIEF DESCRIPTION OF THE DRAWINGS

For a detailed description of various examples, reference will now be made to the accompanying drawings in which:

E. FIG. 5A-5B are profile views of a method of molding a semiconductor package.

F. FIG. 6A-6D are perspective views of the molded semiconductor package.

DETAILED DESCRIPTION

Many electronic devices, such as those in industrial, medical, automotive, and military applications, must operate at a high degree of precision and operate predictably over a long period of time in varying environments. Some integrated circuits (ICs) are designed and manufactured in a way that promotes precise operation. However, the mold compound (e.g., plastic) that is used to cover such ICs can cause an otherwise stable and precise IC to experience undesirable shifts in operating parameters. Generally, such negative effects are caused by filler particles in the mold compound that mechanically stress sensitive areas of the IC and/or semiconductor die on which the IC is formed. Because the distribution and size of these mold compound filler particles is random, the resultant parametric shifts in the IC cannot be easily predicted or corrected. Current solutions to address such challenges entail the use of undesirably bulky and expensive ceramic packages. Other solutions entail the use of coatings that often increase the mechanical stresses placed on the sensitive areas of the IC, thereby exacerbating the very problem that the coatings were intended to solve.

This disclosure describes various examples of a semiconductor package that addresses the challenges described above. In particular, the semiconductor package includes a semiconductor die and an operational component, such as a precision IC, on the semiconductor die. The semiconductor package further includes a cover that couples to the semiconductor die and that covers the operational component, leaving a hollow, inert area in between the cover and the operational component. A mold compound abuts the semiconductor die and the cover, but the mold compound does not abut the operational component. In such examples, the cover precludes the precision operational components, such as precision ICs, from abutting filler particles of mold compounds. As a result, the precision operational components are not exposed to the mechanical stresses applied by such filler particles. Consequently, the precision operational components do not experience the parametric shifts associated with such mechanical stresses. In addition, because in examples the covers are used solely to cover specific operational components and not other areas of the active surface of the semiconductor die, the use of mold compounds, which have relatively superior costs and thermal and electrical characteristics, is increased.

FIGS. 1A-7 are perspective, top-down, bottom-up, and profile views of a process flow for manufacturing a semiconductor package having covers for operational components, in accordance with various examples. FIG. 8 is a flow diagram of a method 800 for manufacturing a semiconductor package having covers for operational components, in accordance with various examples. Accordingly, the process flow of FIGS. 1A-7 is now described in parallel with the method 800 of FIG. 8.

Figure 1A:
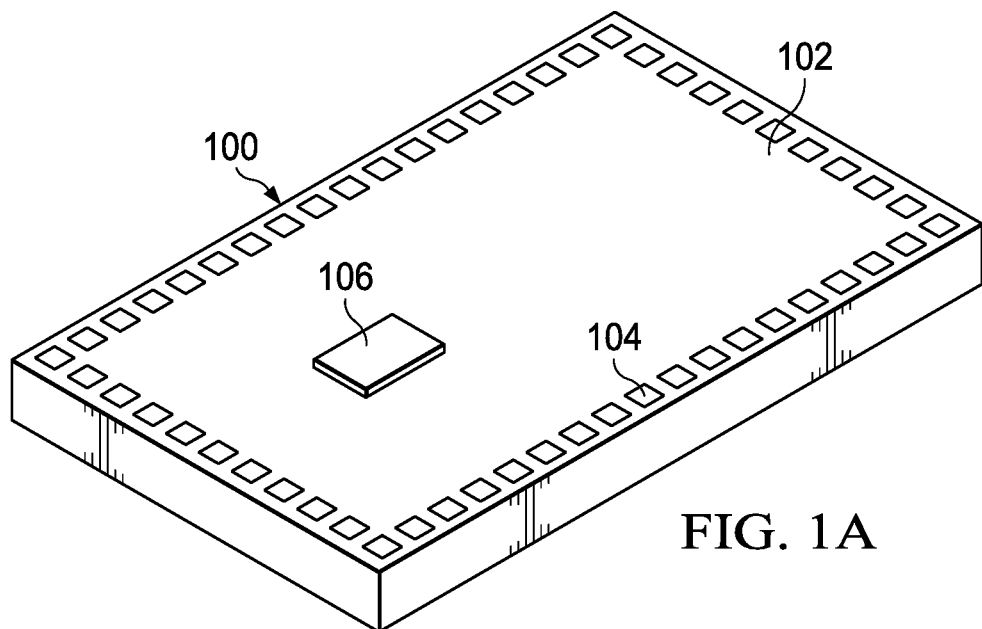
FIG. 1A-1B are profile views of a semiconductor die.
Figure 1B:
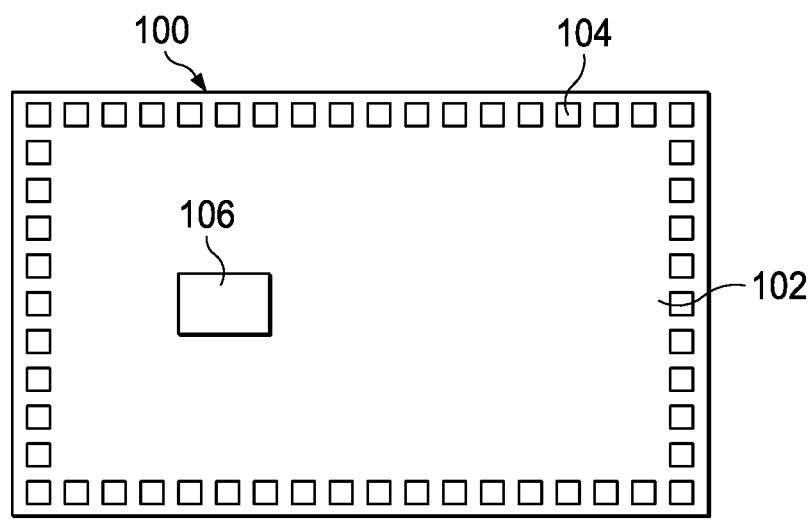

The method 800 begins with providing an inert atmosphere at an operational component of a semiconductor die (802). FIG. 1A is a perspective view of a semiconductor die 100, for example, a silicon die. The semiconductor die 100 may still be part of a semiconductor wafer, or the semiconductor die 100 may already have been singulated from a semiconductor wafer (e.g., by a sawing process). The semiconductor die 100 includes an active surface 102, multiple bond pads 104 (e.g., arranged on a perimeter of the active surface 102), and an operational component 106. In examples, the operational component 106 is a precision circuit, such as a voltage reference or a clock, that is expected to operate with higher degrees of precision relative to other types of circuits. Although referred to herein in the singular, the operational component 106 may be a single component or a group of multiple components. In examples, the operational component 106 is positioned in an area of the active surface 102 (or, more generally, the semiconductor die 100) that is least, or less, susceptible to mechanical stress relative to other areas of the active surface 102 (or, more generally, the semiconductor die 100). For instance, the operational component 106 may be positioned at a center of the active surface 102 such that a center of the operational component 106, or some other portion of the operational component 106, is vertically aligned with a center of the active surface 102 (or, more generally, of the semiconductor die 100). For instance, the operational component 106 may be positioned within a threshold distance from the center of the active surface 102, so that a center of the operational component 106 and a center of the active surface 102 are within 1 millimeter of each other, within 2 millimeters of each other, within 5 millimeters of each other, within 1 centimeter of each other, or within 2 centimeters of each other. In the case where the operational component 106 is a group of multiple components, a center of the group of multiple components taken as a whole and a center of the active surface 102 may be aligned or within 1 millimeter, 2 millimeters, 5 millimeters, 1 centimeter, or 2 centimeters of each other. Although FIG. 1A shows one operational component 106 (which, as explained, may be a single component or a group of components), in examples, the active surface 102 may include multiple operational components 106, each of which may be a single component and/or a group of components. For the sake of clarity and convenience, the remainder of this description assumes the use of one operational component 106. FIG. 1B is a top-down view of the structure of FIG. 1A.

In examples, the operational component 106, or more generally, the semiconductor die 100, is coated with an optional stress buffer. Such buffer coatings may include polyimide, poly(p-phenylene benzobisoxazole) (PBO), silicone, etc. These buffer coatings may further reduce stress on the semiconductor die 100 (or on parts of the semiconductor die 100).

An inert atmosphere may be introduced to the semiconductor die 100, and more specifically, to the vicinity of the operational component 106 on the active surface 102 of the semiconductor die 100. The inert atmosphere may be introduced by modifying the ambient atmosphere during the attach process using, e.g., dry nitrogen, argon, helium, etc. The inert atmosphere should be dry. For example, the moisture content of the atmosphere should be reduced to a degree that would mitigate or eliminate mini-expansions or explosions caused by the rapid expansion of heated vapor in the particular application at hand.

Figure 2A:
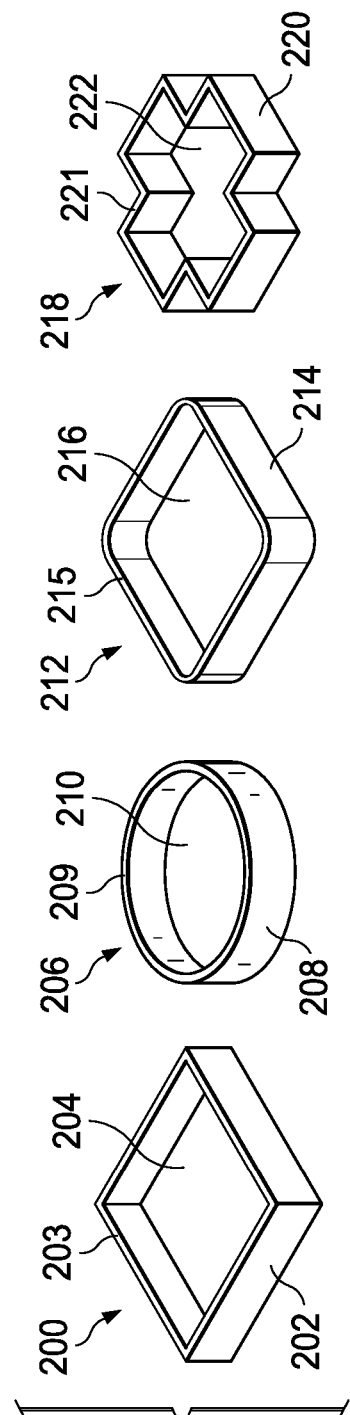
FIG. 2A-2D are profile views of various covers used to cover an operational component.
Figure 2B:
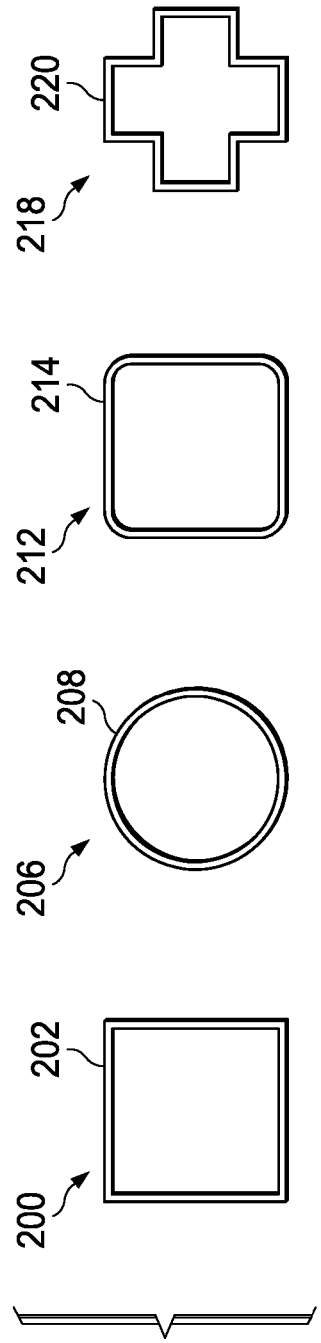
Figure 2C:
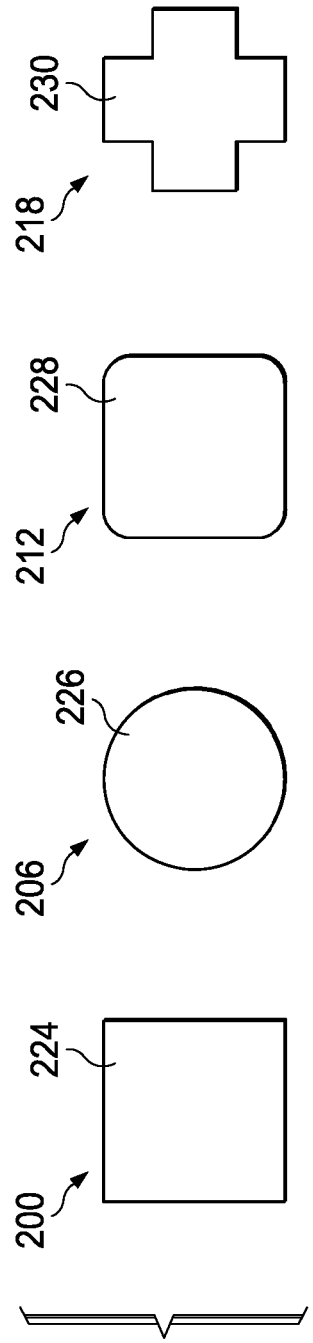
Figure 2D:
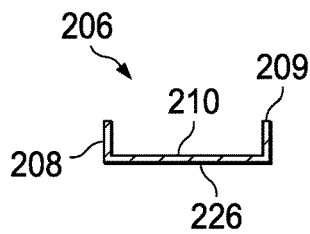

The method 800 comprises positioning a cover on the semiconductor die to cover the operational component of the semiconductor die (804). More specifically, the cover is positioned on an active surface of the semiconductor die. An active surface of a semiconductor die is a surface of the semiconductor die on and/or in which circuitry is formed such that the cover does not electrically couple to the circuitry. For example, if the cover is formed of metal, then when the cover is placed on the active surface, the cover does not electrically couple to the active surface. In the event that the cover is formed of non-conductive materials, such as plastic, the cover may be placed in any suitable manner on the active surface of the semiconductor die. A hollow and inert area exists between the cover and the operational component (804). FIG. 2A is a perspective view of various covers usable to cover the operational component 106, in accordance with examples. In particular, FIG. 2A shows illustrative covers 200, 206, 212, and 218. FIG. 2B provides top-down views of the covers of FIG. 2A. FIG. 2C provides bottom-up views of the covers of FIG. 2A. FIG. 2D provides a profile, cross-sectional view of the cover 206, which is representative of the profile, cross-sectional views of the covers 200, 212, 218. As shown in the top side views of FIGS. 2A, 2B, and 2D, the cover 200 may include a raised portion 202 and a recessed portion 204; the cover 206 may include a raised portion 208 and a recessed portion 210; the cover 212 may include a raised portion 214 and a recessed portion 216; and the cover 218 may include a raised portion 220 and a recessed portion 222. The raised portions, such as raised portions 202, 208, 214, and 220, may be synonymously referred to as vertical portions, and the recessed portions, such as recessed portions 204, 210, 216, and 222, may be synonymously referred to as horizontal portions. In examples, the covers, such as covers 200, 206, 212, and 218, may be monolithic structures. A monolithic structure, as used herein, describes a structure that is a single, standalone component at the time that it is positioned on the semiconductor die 100 to cover the operational component 106. Thus, for example, a component that is assembled using iteratively deposited polymer layers would not qualify as a monolithic structure. A cover that is a single, standalone component at the time that it is positioned on the semiconductor die 100 to cover the operational component 106 is advantageous over other covers because use of such a monolithic structure reduces the number of manufacturing steps, reduces manufacturing cost, reduces manufacturing complexity, and increases flexibility in the types of operational component shapes that may be covered. Furthermore, as shown in the bottom side view of FIG. 2C, the cover 200 may include a bottom surface 224; the cover 206 may include a bottom surface 226; the cover 212 may include a bottom surface 228; and the cover 218 may include a bottom surface 230. In each of the covers 200, 206, 212, and 218, the raised portion may be along a perimeter of the cover, and the recessed portion may be circumscribed by the raised portion. For example, as shown, the raised portion 202, which is positioned along a perimeter of the cover 200, circumscribes the recessed portion 204. Depths of the covers 200, 206, 212, 218 may vary, depending on the height of the operational component 106 to be covered by the covers 200, 206, 212, 218. For example, if the operational component 106 has a height of 1 millimeter, a cover 200, 206, 212, 218 used to cover the operational component 106 may have a depth of 1 millimeter or greater than 1 millimeter to account for a margin (e.g., 1.1 millimeters). In examples, the cover 200, 206, 212, 218 has a depth no more than 1 millimeter. In examples, a depth of a cover 200, 206, 212, 218 may be measured from a top surface of the raised portion 202 to a top surface of the recessed portion 204, where the top surface of the raised portion 202 and the top surface of the recessed portion 204 face the same direction. Other depths are contemplated and included in the scope of this disclosure. In examples, the horizontal cross-sectional area of a cover 200, 206, 212, 218 may vary, depending on the area of the active surface 102 occupied by the operational component 106 to be covered. For example, if the operational component 106 has a horizontal area covering the active surface 102 of 1 mm$^2$, the horizontal cross-sectional area of the corresponding cover 200, 206, 212, 218 may also be 1 mm$^2$ or greater than 1 mm$^2$ to account for a margin (e.g., 1.1 mm$^2$). In examples, the horizontal cross-sectional area of the cover 200, 206, 212, 218 is sufficiently large to cover the operational component 106, because if the cover is too small in area, it will not properly cover the operational component 106. Conversely, the horizontal cross-sectional area of the cover 200, 206, 212, 218 should not be too large, as such an excessively large size results in excess costs than would a mold compound, and further because a mold compound may have superior thermal and electrical characteristics.

The covers 200, 206, 212, 218 may have different shapes. For example, the cover 200 has a rectangular horizontal cross-sectional shape; the cover 206 has a circular horizontal cross-sectional shape; the cover 212 has a rectangular horizontal cross-sectional shape with rounded corners; and the cover 218 has a cross-shaped horizontal cross-section. Other shapes are contemplated and included in the scope of this disclosure. In at least some examples, the shape of a cover 200, 206, 212, 218 is dependent on a shape of the operational component 106 to be covered. An operational component 106 that has a roughly square shape may be covered using the cover 200, while an operational component 106 that has a roughly circular shape may be covered using the cover 206. In some examples, both shape and size are considered together when determining a shape and/or size of a cover 200, 206, 212, 218. In some examples, an operational component 106 having a rectangular shape and a horizontal area of 1 mm$^2$ should not be covered using a circular cover 206 having a horizontal cross-sectional area of 1 mm$^2$, but that same operational component 106 could possibly be covered using a circular cover 206 having a horizontal cross-sectional area of 2 mm$^2$.

The shapes of the raised portions 202, 208, 214, 220 may vary. In some examples, the raised portions 202, 208, 214, 220 have flat top surfaces 203, 209, 215, 221, respectively. Having flat top surfaces 203, 209, 215, 221 facilitates adequate contact with the active surface 102 when the covers are flipped upside down and positioned over the operational component 106, thereby precluding mold compound from flowing between the flat top surfaces 203, 209, 215, 221 and the active surface 102 and onto the operational component 106. For a similar reason, rounded top surfaces 203, 209, 215, 221 are possible but may be avoided so that mold compound does not flow between the rounded top surfaces 203, 209, 215, 221 and the active surface 102. However, in the event that adequate amounts of adhesive (e.g., epoxy) are used to couple rounded top surfaces 203, 209, 215, 221 to the active surface 102 so as to mitigate the flow of mold compound, such rounded top surfaces may be acceptable.

The covers 200, 206, 212, 218 may be composed of any suitable material. In examples, the covers 200, 206, 212, 218 are composed of metal, plastic, fiberglass, or ceramic. Other materials are also contemplated. In examples, the covers 200, 206, 212, 218 are formed from raw materials (e.g., sheets of raw materials) using any suitable technique, including punching, molding, stamping, and/or coining. In some examples, outer surfaces of the covers 200, 206, 212, 218 may be slanted or stepped to improve locking with a mold compound that is later applied to cover the covers 200, 206, 212, 218, as described below. Because the covers 200, 206, 212, 218 are formed independently of the semiconductor die 100 and the packaging process, the covers may be formed in any suitable shape and/or size, thus enabling the customized creation of covers that precisely fit operational components of various shapes and/or sizes.

Figure 3A:
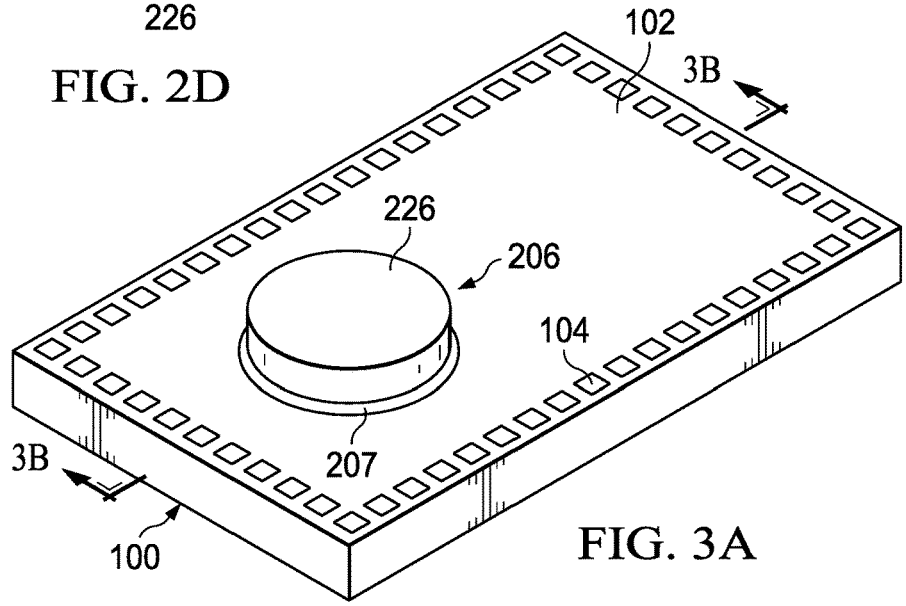
FIG. 3A-3C are perspective views of the cover on the operational component.
Figure 3B:
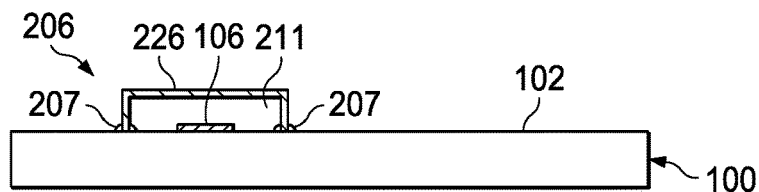
Figure 3C:
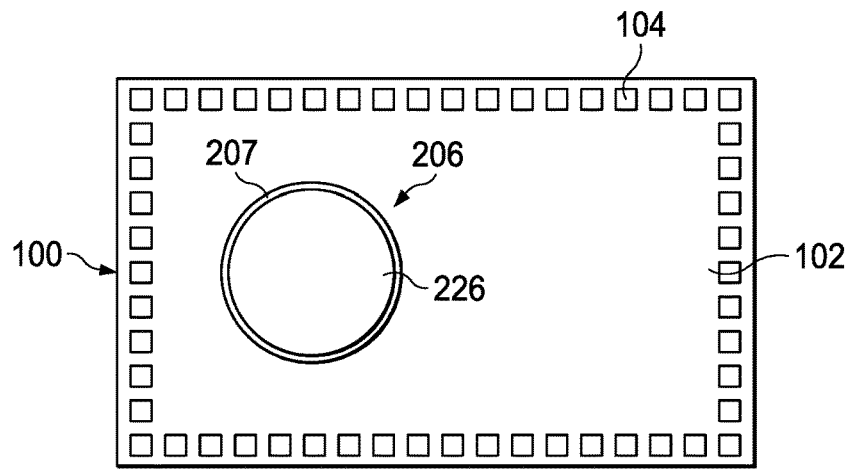

FIG. 3A is a perspective view of the cover 206 positioned on (e.g., coupled to) the active surface 102 so as to cover the operational component 106 of the semiconductor die 100. Cover 206 is representative of the covers 200, 212, 218, and any of the covers 200, 212, 218, as well as a different cover, could be substituted for the cover 206 in the description below. As shown in FIG. 3A, the cover 206 covers (e.g., completely covers) the operational component 106. The cover 206 may couple to the active surface 102 using any suitable material, including various adhesives, solder, epoxy, etc. In at least some examples, the cover 206 is composed of a metal or metal alloy and solder or another non-organic material is used to couple the cover 206 to the active surface 102, thereby forming a hermetic or at least semi-hermetic seal around the operational component 106. In this way, the inert atmosphere inside the cover 206 may be preserved. FIG. 3B is a profile, cross-sectional view of the structure of FIG. 3A. As shown, the cover 206 couples to the active surface 102 using adhesive 207 (e.g., solder or another metal or metal alloy; epoxy), thereby covering the operational component 106. In examples, the adhesive 207 is sufficiently strong so that during application of the mold compound as described below, the cover 206 is stationary. In examples, the adhesive 207 has a strength of at least 35 N/mm$^2$, and in some examples, the adhesive strength ranges from 35 N/mm$^2$ to 41 N/mm$^2$. In some examples, a portion (e.g., the center) of the operational component 106 is vertically aligned with a center of the semiconductor die 100, and so a portion (e.g., the center) of the cover 206 may likewise be vertically aligned with the center of the semiconductor die 100. As explained, a center of the semiconductor die 100 tends to be a stress-neutral location relative to areas closer to edges of the semiconductor die 100. In examples, a portion (e.g., the center) of the operational component 106 is located closer to the center of the semiconductor die 100 than to an edge of the semiconductor die 100, and so a portion (e.g., the center) of the cover 206 is also located closer to the center of the semiconductor die 100 than to an edge of the semiconductor die 100. An inert atmosphere may be present in a hollow cavity 211 formed by the cover 206, and the operational component 106 may be located within this cavity 211. In some examples, the atmosphere present in the hollow cavity 211 is not inert. FIG. 3C is a top-down view of the structure of FIG. 3A. The cavity 211 may have approximately the same dimensions as the cover 206 in some examples (e.g., a vertical depth of less than or equal to 1 millimeter from the semiconductor die 100 to the cover 206).

Figure 4A:
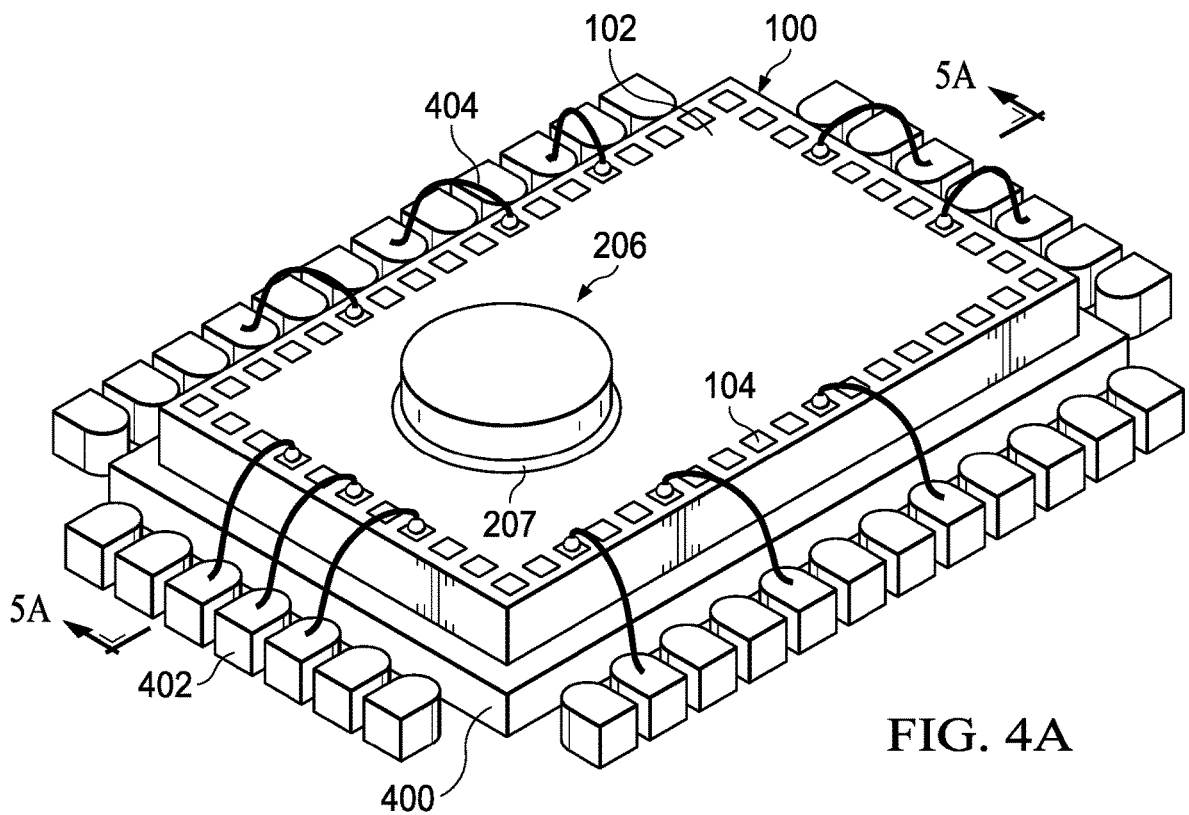
FIG. 4A-4B are perspective views of the semiconductor die coupled to respective pads.
Figure 4B:
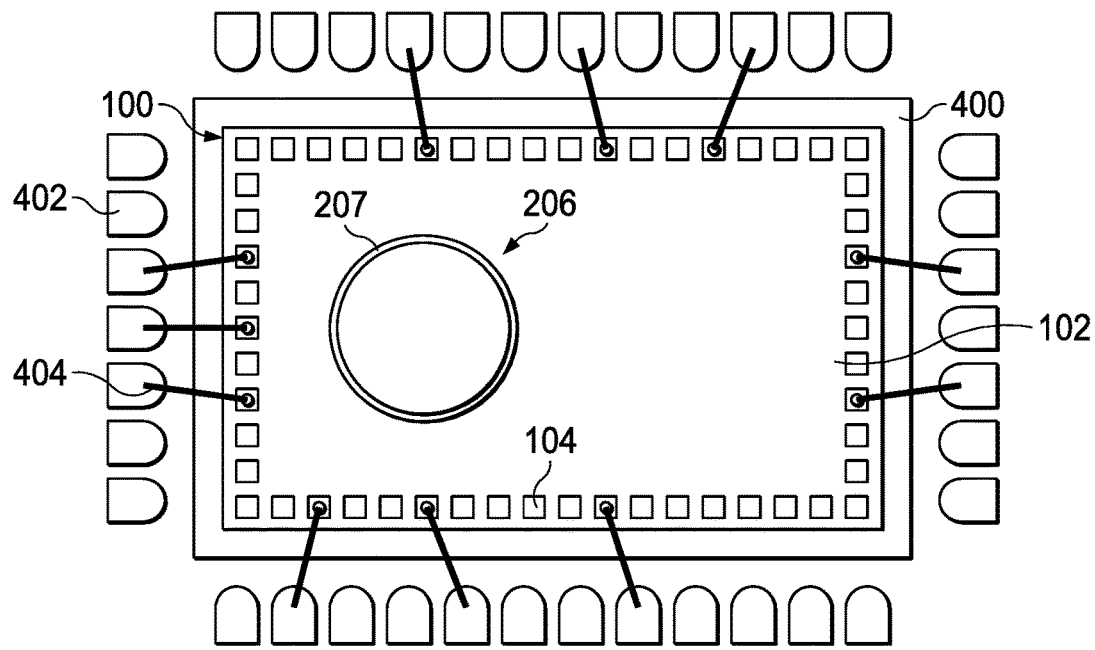

FIG. 4A is a perspective view of the semiconductor die 100 coupled to a die pad 400. The die pad 400 may be part of a lead frame or may have been singulated from a lead frame. The semiconductor die 100 may couple to the die pad 400 using any suitable type of adhesive, for example, a conductive or non-conductive epoxy. Bond wires 404 couple bond pads 104 to conductive terminals (e.g., leads) 402 as shown. FIG. 4B is a top-down view of the structure of FIG. 4A.

The method 800 comprises positioning the semiconductor die and the cover in a mold chase (806) and positioning a member of the mold chase so that the member does not abut the cover (808). FIG. 5A is a profile cross-sectional view of the structure of FIG. 4A positioned inside a mold chase. Specifically, a top member 500 of a mold chase is shown, with the bottom member of the mold chase omitted for clarity. The top member 500 of the mold chase is lowered, but not so low that it abuts the cover 206. A gap 502 remains between the top member 500 and the cover 206. In examples, for a given package height, a height of the gap 502 is enlarged and a depth of the cover 206 is reduced to reduce costs associated with the cover 206 and to increase use of the less expensive mold compound 504 with superior thermal and electrical characteristics. In examples, a topside film assist is omitted so that the mold compound is able to cover the cover 206.

Figure 6B:
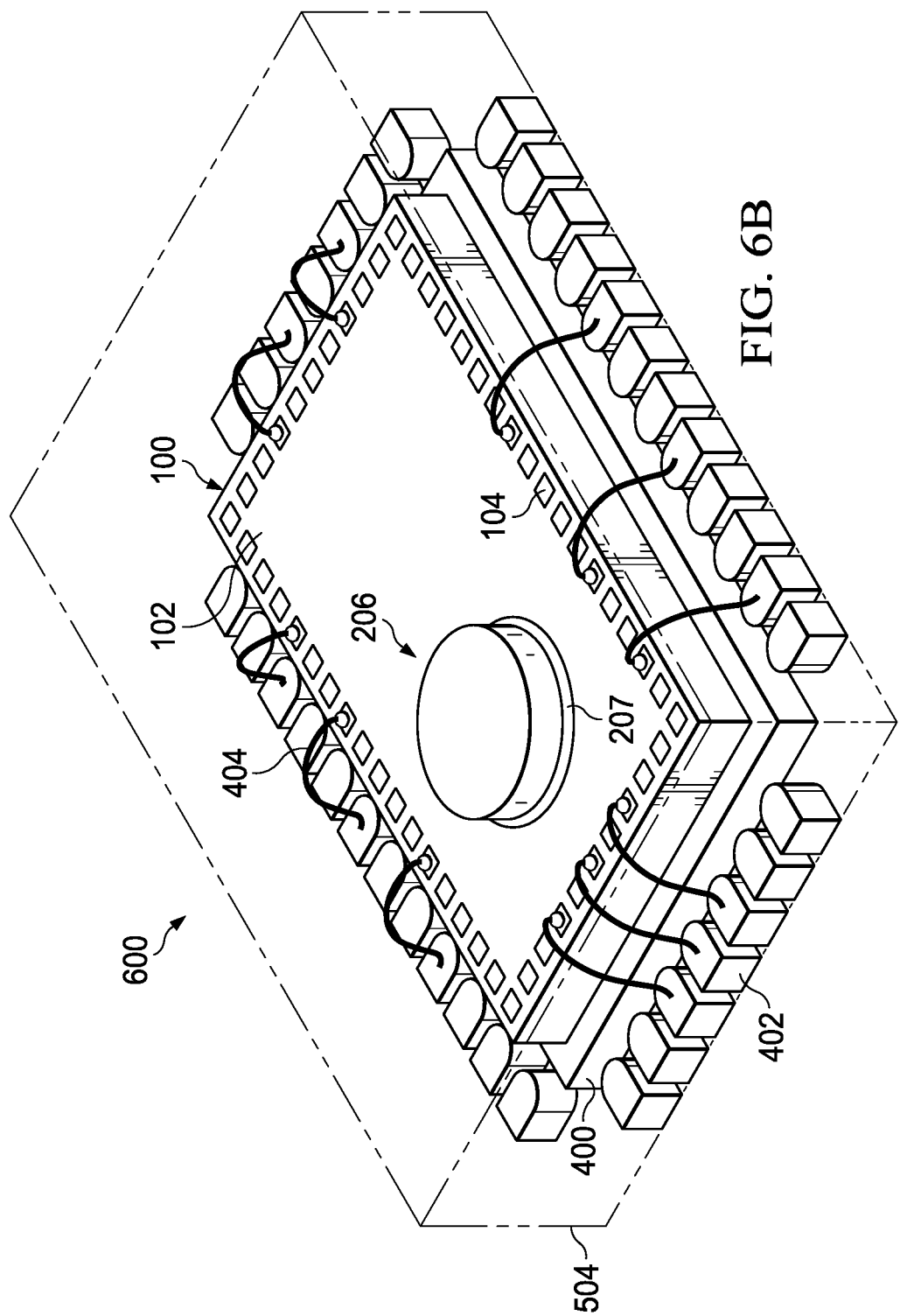
Figure 6C:
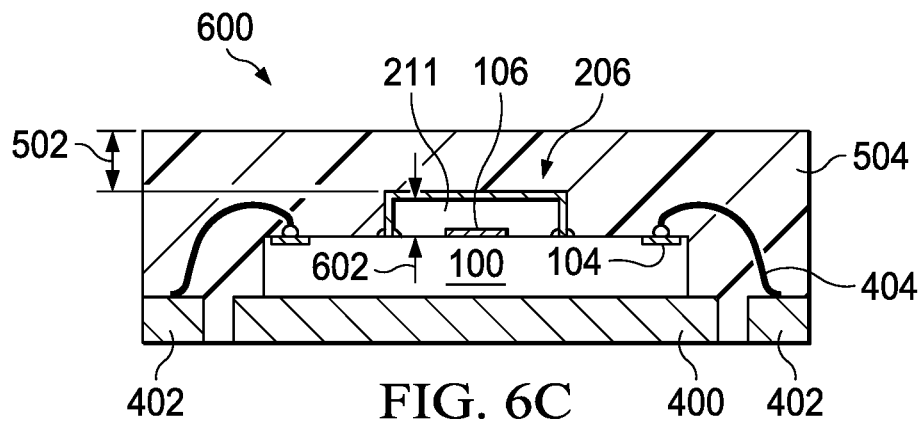

The method 800 comprises introducing a mold compound into the mold chase to cover the semiconductor die and the cover (810). The cover precludes the mold compound from abutting the operational component (810). FIG. 5B is a profile cross-sectional view of the structure of FIG. 5A, but with mold compound 504 having been applied (e.g., injected) between the top member 500 of the mold chase and the semiconductor die 100, as well as between the top member 500 and the cover 206 (e.g., in the gap 502). The mold compound 504 abuts the semiconductor die 100 and the cover 206 (e.g., a top surface 503 of the cover 206 and an outer surface 505 of the cover 206), but not the operational component 106. The resulting structure is then removed from the mold chase and singulated, resulting in a semiconductor package 600 as shown in FIG. 6A. FIG. 6A is a perspective view of the semiconductor package 600 manufactured using the techniques described herein. The components of the semiconductor package 600 are covered by a mold compound 504. Conductive terminals 402 are exposed to an exterior surface of the semiconductor package 600. FIG. 6B is a perspective view of the semiconductor package 600 with the mold compound 504 being translucent so that the components of the semiconductor package 600 covered by the mold compound 504 are visible. FIG. 6C is a profile cross-sectional view of the semiconductor package 600, in which the cover 206 forms the aforementioned cavity 211 in the mold compound 504. As explained above, in examples, the height of the gap 502 is made as large as possible and a depth 602 of the cover 206 is made as small as possible.

Figure 6D:
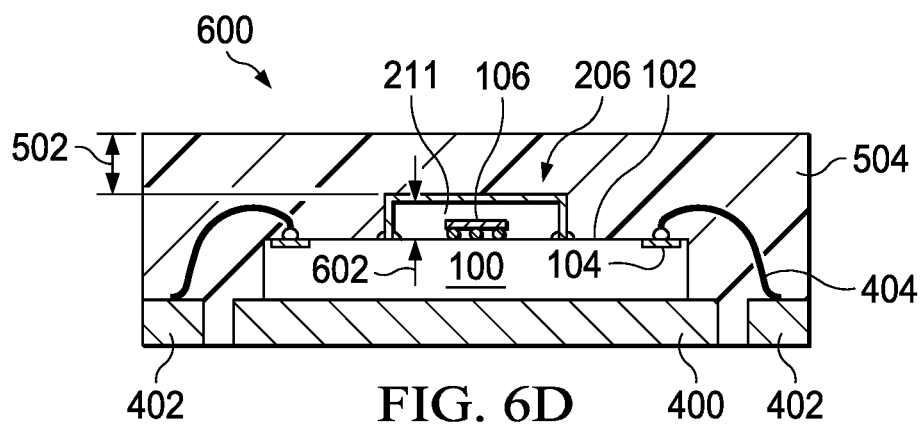

FIG. 6D is a profile cross-sectional view of an example semiconductor package 600 in which the operational component 106 is a device, such as a bulk acoustic wave (BAW) device, a passive component (e.g., resistor, capacitor), etc. that is not formed in or on the active surface 102 but that is rather a standalone device coupled to the active surface 102, as shown. Generally, the operational component 106 may comprise any of a variety of device(s), including circuitry that is formed in or on the semiconductor die 100 and circuitry that is manufactured separately and subsequently stacked on top of (e.g., coupled to) the semiconductor die 100.

Figure 7:
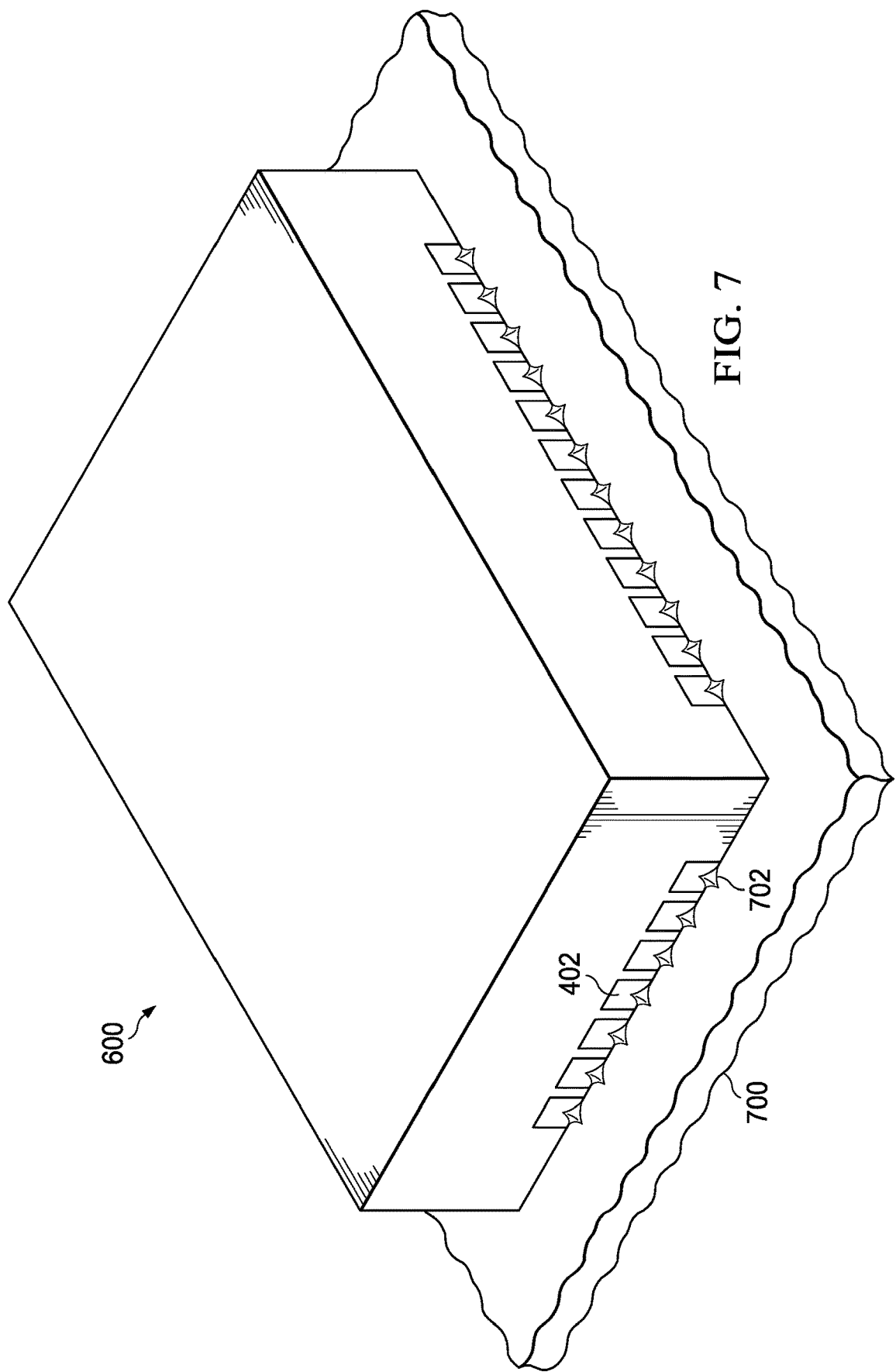
FIG. 7 is a perspective view of the semiconductor package coupled to a printed circuit board.
Figure 8:
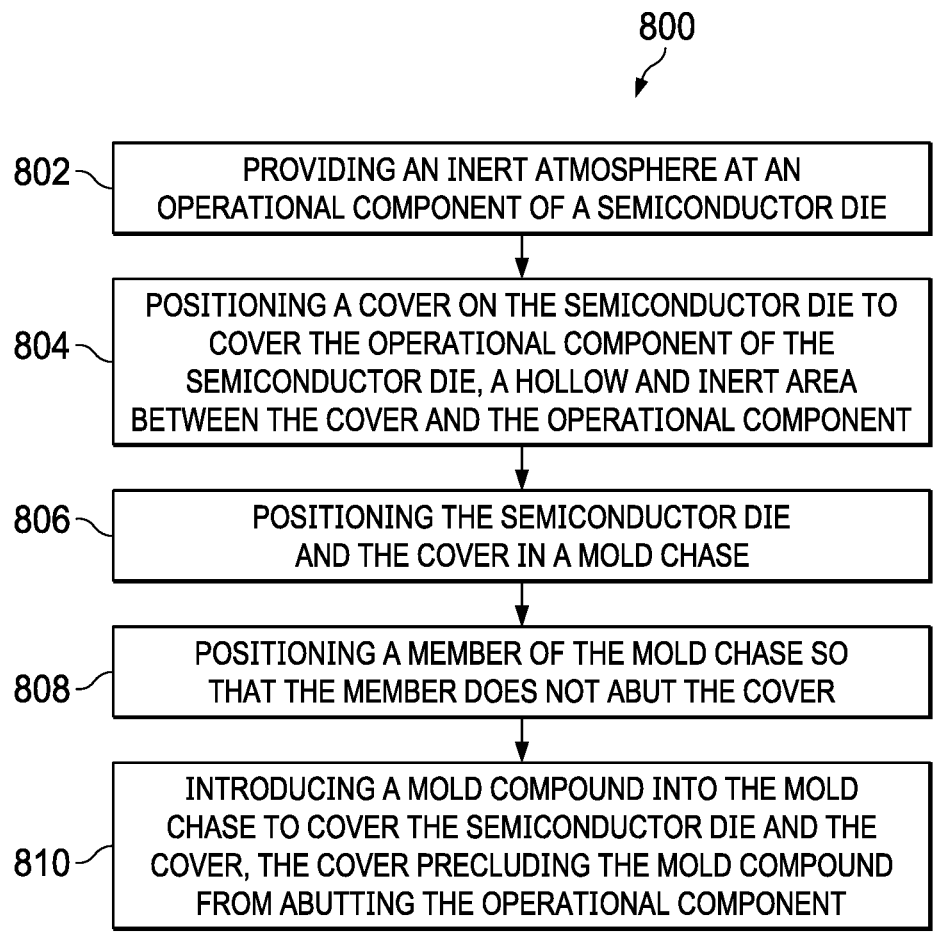
FIG. 8 is a flow diagram of a method 800 for manufacturing a semiconductor package having covers for operational components, in accordance with various examples.
Figure 9:
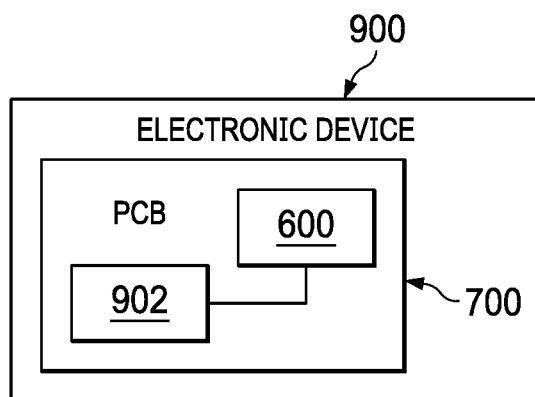
FIG. 9 is a schematic block diagram of an illustrative electronic device implementing a semiconductor package having covers for operational components, in accordance with various examples.

FIG. 7 is a perspective view of the semiconductor package 600 coupled to a printed circuit board (PCB) 700. The conductive terminals 402 couple to conductive terminals (not expressly shown) on the PCB 700 via, e.g., solder connections 702. FIG. 9 is a schematic block diagram of an electronic device 900 (e.g., a consumer electronic device, an automobile, an aircraft) containing the PCB 700, in accordance with various examples. The PCB 700 includes the semiconductor package 600 and other circuitry 902 (e.g., a controller or central processing unit) coupled to the semiconductor package 600. The circuitry 902 exchanges signals with the semiconductor package 600 as may be suitable to perform action(s) expected of the electronic device 900.

In the foregoing discussion and in the claims, the terms "including" and "comprising" are used in an open-ended fashion, and thus mean "including, but not limited to . . . ." Also, the term "couple" or "couples" means either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means+/−10 percent of the stated value.

The above discussion is illustrative of the principles and various embodiments of the present disclosure. Numerous variations and modifications will become apparent to those skilled in the art once the above disclosure is fully appreciated. The following claims should be interpreted to embrace all such variations and modifications.

What is claimed is:

1. A method of making a semiconductor package, comprising:
   positioning a cover on a semiconductor die to cover an operational component of the semiconductor die, such that a hollow area is in between the cover and the operational component, wherein a perimeter of the cover is proximate to the operational component than a perimeter of the semiconductor die;
   positioning the semiconductor die and the cover in a mold chase;
   positioning a member of the mold chase so that the member does not contact the cover; and
   introducing a mold compound into the mold chase to cover the semiconductor die and the cover, the cover precluding the mold compound from contacting the operational component.

2. The method of claim 1 further comprising, prior to positioning the cover, providing an inert atmosphere at an operational component of a semiconductor die.

3. The method of claim 1, wherein the cover forms a hermetic seal around at least part of the operational component.

4. The method of claim 1, wherein the cover forms a hermetic seal around the operational component between a surface of the cover and the semiconductor die.

5. The method of claim 1, wherein the cover comprises metal and is coupled to the semiconductor die with solder.

6. The method of claim 1, wherein the operational component is positioned closer to a center of the semiconductor die than to an edge of the semiconductor die.

7. The method of claim 1, wherein the operational component is located at a center of the semiconductor die.

8. The method of claim 1, wherein the cover comprises one of a rectangular horizontal cross-sectional shape, a circular horizontal cross-sectional shape, a rectangular horizontal cross-sectional shape with rounded corners; and a cross-shaped horizontal cross-sectional shape.

9. The method of claim 1, wherein a vertical dimension of the cover does not exceed 1 millimeter.

10. The method of claim 1, wherein the cover includes a monolithic structure including a vertical portion and a horizontal portion.

11. A method of making a semiconductor package, comprising:
positioning a cover on a semiconductor die to cover an operational component of the semiconductor die, such that a hollow area is formed between the cover and the operational component, wherein the cover includes a monolithic structure including a vertical portion and a horizontal portion, a perimeter of the cover along the vertical portion being closer to the operational component than an edge of the semiconductor die;
positioning the semiconductor die and the cover in a mold chase; and
introducing a mold compound into the mold chase to cover the semiconductor die and the cover, the cover precluding the mold compound from contacting the operational component.

12. The method of claim 11, wherein positioning the cover on the semiconductor die to cover the operational component includes attaching the cover to a top surface of the semiconductor die using a metal or a metal alloy.

13. The method of claim 11, wherein the operational component is a precision circuit of the semiconductor die.

14. A method of making a semiconductor package, comprising:
attaching a semiconductor die to a lead frame and electrically connecting the semiconductor die to leads of the lead frame;
attaching a cover on the semiconductor die over an operational component of the semiconductor die, such that a hollow area is between the cover and the operational component, wherein the cover includes a monolithic structure including a vertical portion and a horizontal portion, a perimeter of the cover along the vertical portion being closer to the operational component than an edge of the semiconductor die;
positioning the semiconductor die and the cover in a mold chase; and
introducing a mold compound into the mold chase to cover the semiconductor die and the cover, the cover precluding the mold compound from contacting the operational component.

15. The method of claim 14, wherein the cover comprises one of a rectangular horizontal cross-sectional shape, a circular horizontal cross-sectional shape, a rectangular horizontal cross-sectional shape with rounded corners; and a cross-shaped horizontal cross-sectional shape.

16. The method of claim 14, wherein a vertical dimension of the cover does not exceed 1 millimeter.

17. The semiconductor package of claim 14, wherein the hollow area is inert.

18. The semiconductor package of claim 14, wherein the cover is attached to an active surface of the semiconductor die.

19. The semiconductor package of claim 14, wherein the cover is attached to the semiconductor die with a metal or metal alloy.

20. The semiconductor package of claim 14, wherein the cover is attached to the semiconductor die with an adhesive.

* * * * *